Aug. 8, 1961 G. F. MONTGOMERY 2,995,712

HIGH-INPUT-IMPEDANCE TRANSISTOR AMPLIFIER

Filed June 3, 1959

INVENTOR

George Franklin Montgomery

BY Arthur Vinograd

ATTORNEY

United States Patent Office
2,995,712
Patented Aug. 8, 1961

2,995,712
HIGH-INPUT-IMPEDANCE TRANSISTOR AMPLIFIER

George Franklin Montgomery, Washington, D.C., assignor to the United States of America as represented by the Secretary of Commerce Filed June 3, 1959, Ser. No. 817,960
6 Claims. (Cl. 330—19)

This invention relates to signal amplifier circuits and in particular to a high-impedance signal amplifier utilizing transistors.

The desirability of an amplifier having high input impedance is well known in the electronic arts since such amplifiers minimize the problem of loading the source which feeds the amplifier. Of the various possible connections for a transistor amplifier, the common-collector or emitter-follower configuration is known to provide the highest input impedance. Such transistor configuration is employed, for example, in the patent to Stanley 2,858,379 which discloses a transistor amplifier comprising a plurality of cascaded transistor stages, the input having a high impedance.

The Stanley amplifier, as well as all known existing amplifiers of the general type contemplated, employ a grounded power supply for supplying the necessary power and bias potentials to the transistors.

In accordance with the principles of the present invention a signal amplifier is provided comprising a plurality of transistor stages connected in cascade so that the emitter voltage is made to follow the input signal applied to the base. By using a floating power supply, in place of a grounded type as in the Stanley patent, as effective an electrical performance can be obtained with considerable savings in electrical components as will become apparent. The power supply is isolated from A.C. ground and the output is taken from the emitter circuit of the second stage of the amplifier thereby enabling the construction of a high input impedance transistor amplifier with a minimum number of parts.

It is accordingly an immediate object of the present invention to provide an improved transistor amplifier having high input impedance.

Another object of this invention is to provide a transistor amplifier in which the power supply is ungrounded.

A further object of this invention is to provide a high-input impedance transistor amplifier having a minimum number of parts.

Other uses and advantages of the invention will become apparent upon reference to the specification and drawings in which.

Figure 1:
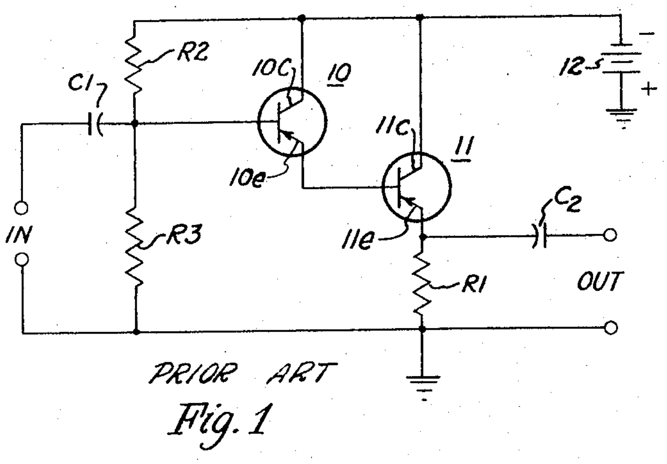
FIG. 1 is a circuit diagram of a conventional transistor amplifier circuit.

FIG. 1 shows a conventional cascaded stage transistor amplifier comprising a first-stage transistor 10 and second-stage transistor 11. The collectors 10*c*, 11*c* of each transistor are connected in common to the negative terminal of a power source represented by the battery 12. The positive terminal of power supply 12 is grounded. The emitter 10*e* of transistor 10 is coupled to the base of the transistor 11 and the emitter 11*e* of transistor 11 in the second stage is connected to ground through a resistor R1. The output is obtained between the emitter 11*e* of transistor 11 and ground through a capacitor C2. The input signal is applied to the base electrode of the transistor 10 in the first stage through a capacitor C1. The biasing network comprising resistors R2 and R3 connect the base of transistor 10 to the power supply 12 and to ground, respectively.

It can be shown that a cascaded stage amplifier of the type shown in FIG. 1 has an input resistance conforming to $\beta_1\beta_2R$ where $\beta_1$, $\beta_2$ are the current amplifications of the first and second transistors and R represents the load resistance at the emitter of the second transistor such as the resistor R1 shown in FIG. 1. Such input resistance is, however, shunted by the resistance of the collector 10*c* of the first transistor 10 and the effective resistance of its biasing network, namely, resistors R2 and R3. If the value of the input resistance $\beta_1\beta_2R$ is large, the shunting effect of such parallel resistance will of course establish the limit of the effective input resistance.

In Patent No. 2,881,269 issued to R. A. Hanel et al., it is shown how feedback may be applied from the emitter of the second stage of a cascade-connected amplifier to the collector of the first stage to reduce the above-described shunting effect introduced by the collector resistance. However, additional coupling components are needed in such amplifier to form the feedback circuit.

Figure 2:
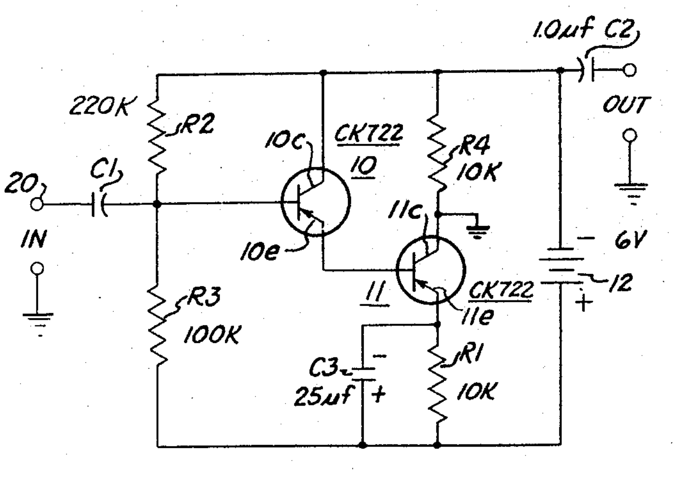
FIG. 2 is a circuit diagram showing the improvements comprising applicant's invention.

In accordance with the principles of the present invention the power supply is permitted to float with respect to A.C. ground, and the necessary feedback to reduce the shunting effect of the collector resistance and the biasing network can then be obtained by the use of only two additional components. Such principles are embodied in the circuit of FIG. 2. FIG. 2 shows an amplifier comprising a plurality of cascade connected transistor stages similar to FIG. 1. The transistors 10 and 11 may be of the CK722 type. The base electrode of the transistor 10 in the first stage is connected to a signal input terminal 20 through the capacitor C1. The elements previously described in connection with FIG. 1 which appear in FIG. 2 are designated by like reference numerals. The emitter electrode 10*e* of transistor 10 is connected to the base of transistor 11. The collector 10*c* of transistor 10 is connected to one terminal of the power supply 12 which is also represented in FIG. 2 by a battery. The collector 11*c* of transistor 11 is grounded and is connected through a resistor R4 together with collector 10*c* to the negative terminal of power supply 12. The emitter bias resistor R1 is connected from the emitter of transistor 11 to the positive terminal of the power source 12 which is ungrounded and such emitter bias resistor is by-passed by a capacitor C3 to prevent signal degeneration. The bias resistors R2 and R3 connect the base electrode of transistor 10 to the negative and positive terminals, respectively of power source 12. The capacitor C2 in the output circuit of the transistor amplifier isolates the power source 12 from A.C. ground as indicated in FIG. 2. It will be noted that the circuit of FIG. 2 includes only two additional components, C3 and R4 as compared to the construction of FIG. 1.

With the output of the circuit of FIG. 2 open circuited, the voltage amplification in the audio frequency range is nearly unity, and the input resistance is about 1 megohm. When the output load is of approximately 1,000 ohms, the voltage amplification is 0.8 and the input resistance is about 150,000 ohms. By using more expensive high-gain transistors having low leakage current, the bias resistances can be increased, and an input resistances of 50–100 megohms can be obtained by using the circuit of FIG. 2.

The amplifier construction of FIG. 2 is useful wherever a high impedance, low voltage source must be used to drive a medium impedance load. It is similar in performance to a vacuum tube, cathode-follower amplifier. An amplifier having the component values indicated in FIG. 2 has a voltage amplification of approximately unity as above indicated over a frequency range of from 10 cycles per second to 20 kilocycles As indicated above, neither battery terminal is at ground potential. When the amplifier construction of FIG. 2 is mounted in a metal chassis, the power supply is therefore insulated from the chassis, and where high frequency performance is essential the battery is physical oriented so as to minimize its capacitance to the chassis.

It will be apparent that the embodiments shown are only exemplary and that various modifications can be made in construction and arrangement within the scope of invention as defined in the appended claims.

What is claimed is:

1. A direct-coupled amplifier comprising a plurality of common collector stages connected in cascade, each including a transistor, the emitter of the transistor in each stage except the last stage being connected to the base of the transistor in the succeeding stage, an output terminal, a source of power connected between said output terminal and the emitter of the transistor in said last stage, an impedance element connected between said output terminal and ground, means for connecting the collector of the transistor in said last stage to ground, means for connecting said output terminal to the collector of the transistor in the first stage of said plurality of stages, a biasing network connected between the collector and base of the transistor in said first stage, and means for applying an input signal to the base of said last-mentioned transistor.

2. The direct-coupled amplifier set forth in claim 1 wherein said source of power includes a source of potential connected in series with an impedance element and a capacitor connected across said impedance element.

3. A direct-coupled amplifier comprising a plurality of common collector stages connected in cascade, each including a transistor, the emitter of the transistor in each stage, except the last stage being connected to the base of the transistor in the succeeding stage, an output terminal, a source of power connected between said output terminal and the emitter of the transistor in said last stage, an impedance element connected between said output terminal and ground, means for connecting the collector of the transistor in said last stage to ground, means for connecting said output terminal to the collector of the transistor in the first stage of said plurality of stages, a first biasing network connected between the base of the transistor in said first stage and the emitter of the transistor in said last stage, and means for applying an input signal to the base of the transistor in said first stage.

4. The direct-coupled amplifier set forth in claim 3 wherein said first biasing network includes an impedance element and a capacitor connected across said impedance element.

5. The direct-coupled amplifier set forth in claim 3 including a second biasing network connected between the collector and base of the transistor in said first stage.

6. The direct-coupled amplifier set forth in claim 5 wherein said first biasing network includes an impedance element and a capacitor connected across said impedance element.

References Cited in the file of this patent

UNITED STATES PATENTS

| | | |
|---|---|---|
| 2,858,379 | Stanley | Oct. 28, 1958 |
| 2,881,269 | Hanel et al. | Apr. 7, 1959 |